United States Patent [19]

Matsushita

[11] Patent Number: 4,645,546
[45] Date of Patent: Feb. 24, 1987

[54] SEMICONDUCTOR SUBSTRATE

[75] Inventor: Yoshiaki Matsushita, Kawasaki, Japan

[73] Assignee: Kabushiki Kaisha Toshiba, Japan

[21] Appl. No.: 754,298

[22] Filed: Jul. 12, 1985

[30] Foreign Application Priority Data

Jul. 13, 1984 [JP] Japan .................................. 59-145348

[51] Int. Cl.$^4$ ..................... H01L 21/324; H01L 29/04
[52] U.S. Cl. ..................................... 148/33; 148/33.3; 148/1.5; 148/DIG. 60; 29/576 T; 156/DIG. 66
[58] Field of Search ................ 29/571, 576 T; 148/33, 148/33.3, 33.4, 174, 175, 1.5, DIG. 60; 156/DIG. 66

[56] References Cited

U.S. PATENT DOCUMENTS

| | | | |
|---|---|---|---|
| 3,811,975 | 5/1974 | Lierop et al. | 148/DIG. 60 X |
| 3,997,368 | 12/1976 | Petroff et al. | 148/DIG. 60 X |
| 4,053,335 | 10/1977 | Hu | 148/DIG. 60 X |
| 4,375,125 | 3/1983 | Byatt | 148/1.5 X |
| 4,472,210 | 9/1984 | Wu et al. | 148/1.5 |

FOREIGN PATENT DOCUMENTS

| | | | |
|---|---|---|---|
| 0066461 | 12/1982 | European Pat. Off. | 148/DIG. 60 |
| 0211737 | 12/1982 | Japan | 148/DIG. 60 |

OTHER PUBLICATIONS

Arst et al, "Increased Oxygen Precipitation in CZ Silicon Wafers Covered by Polysilicon" J. Elec. Mats, vol. 13, No. 5, Sep. 1984 pp. 763–778.
Beyer et al, "Gettering and Barrier Technique" IBM Tech. Disc. Bull., vol. 19, No. 6, Nov. 1976 pp. 2050–2051.
Craven et al, "Internal Gettering in Silicon", Solid State Tech. Jul. 1981 pp. 55–61.
Tice et al, "Precipitation of Oxygen and Intrinsic Gettering in Silicon" Defects In Semiconductors, North Holland, Inc. 1981, pp. 367–380.
Pak et al, "Phosphorus Diffusion Gettering" IBM Tech. Disc. Bull., vol. 18, No. 7, Dec. 1975, p. 2183.
Schlosser et al, "A New Method of Impurity Gettering in Polycrystalline Solarcells" Conf. Record 16th IEEE Photovoltaic Specialists Conf. Jan. 1983, pp. 532–536.
Suzuki, et al., "CZ Silicon Crystals Grown in a Transverse Magnetic Field," Semiconductor Silicon, p. 90, 1981.
Craven et al., "The Effects of Multiple Oxidation on Polysilicon Enhanced Gettered Wafers", ECS Ext. Abstract 83-2, Abstract No. 308, pp. 484–485.

*Primary Examiner*—Brian E. Hearn
*Assistant Examiner*—David A. Hey
*Attorney, Agent, or Firm*—Finnegan, Henderson, Farabow, Garrett & Dunner

[57] ABSTRACT

Disclosed is a silicon semiconductor substrate for a semiconductor integrated circuit such as LSI or VLSI. The silicon semiconductor substrate has an oxygen concentration ranging from $3 \times 10^{17}$ cm$^{-3}$ to $7 \times 10^{17}$ cm$^{-3}$ and a gettering layer on its backside. This gettering layer may comprise a nonsingle crystalline silicon layer such as polycrystalline silicon layer or amorphous silicon layer, or a layer having stacking fault density of more than $3 \times 10^4$ cm$^{-2}$.

9 Claims, 6 Drawing Figures

F I G. 1
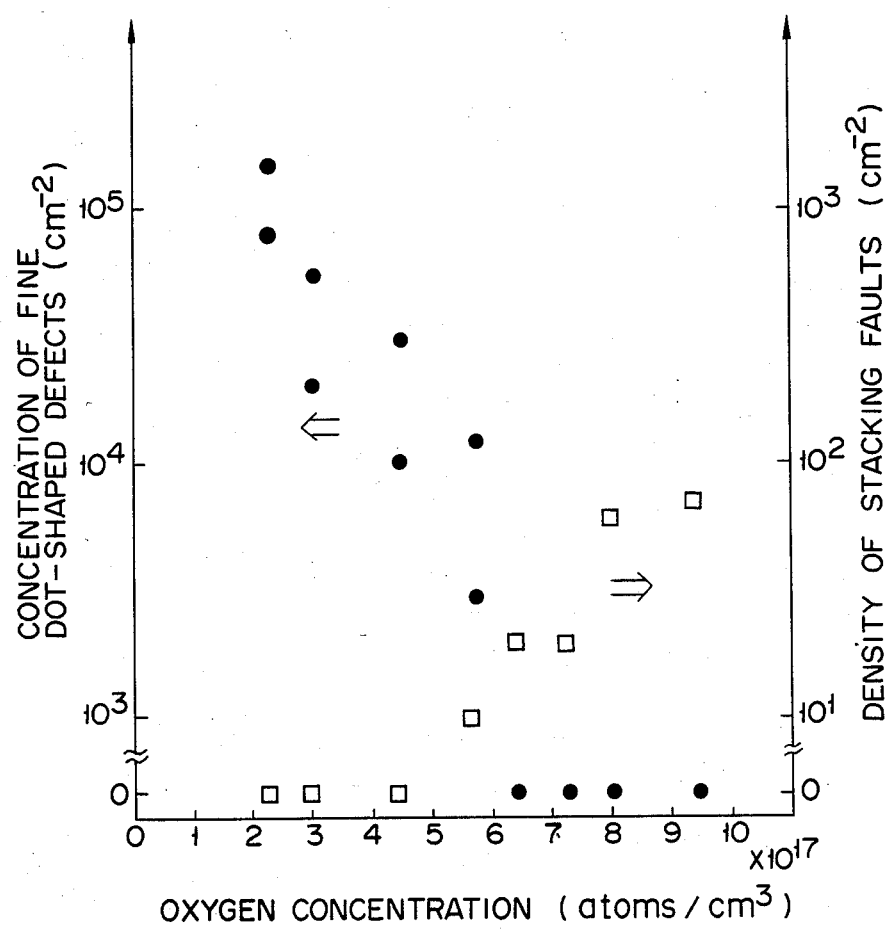

SEMICONDUCTOR SUBSTRATE

BACKGROUND OF THE INVENTION (a) Field of the Invention

This invention relates to a semiconductor substrate adapted for the manufacture of a semiconductor integrated circuit such as the LSI and VLSI types, and, more particularly, to a silicon semiconductor substrate.

(b) Description of the Prior Art

Hitherto, the LSI type silicon substrate (wafer) has been provided by a wafer cut out of a single crystal silicon ingot grown by the Czochralski (abbreviated as "CZ") method. However, the ordinary CZ method has the following drawback. Since a quartz crucible is applied, the quartz is melted into a molten mass of silicon. As a result, oxygen is carried into a single crystal silicon ingot to the extent of $1.0 \times 10^{18}$ cm$^{-3}$. Later, the semiconductor substrate cut out of said single crystal silicon ingot is subjected to heat treatment at a temperature of about 900° to 1000° C., applied in the LSI manufacturing process. On this occasion $SiO_2$ is crystallized out of the substrate because the released oxygen is contained in the substrate in the supersaturated form, leading to the occurrence of defects such as dislocation and stacking fault. When said dislocation or stacking fault is carried into the activated region of the substrate element, drawbacks such as PN junction leak, or, in the case of MOS memory, shortening of the pause time, are caused to occur.

To avoid the above-mentioned harmful effects caused by supersaturated oxygen, an intrinsic gettering (IG) wafer (hereinafter referred to as the "IG wafer") has been proposed. This wafer is prepared by letting the oxygen content of the activated element region escape to the outside by applying high temperature heat treatment and by depositing crystallized substances (fine defects) capable of gettering harmful metals, in the interior of said wafer. The IG wafer can, indeed, withstand the occurrence of dislocation or stacking fault near its surface. When applied to the manufacture of MOSLSI, however, the IG wafer cannot completely eliminate the defects of a thin oxidized membrane (gate oxidized membrane). The reason being that extremely fine defects retained in the single crystal silicon ingot are carried into the aforesaid oxidized membrane, leading to a decline in the withstand voltage property of said oxidized membrane. This drawback arises from the fact that since the extremely fine defects are carried into the silicon ingot not only by the oxygen contained in said silicon but also as a result of the instability of the solid-liquid interface occurring during the growth of the silicon crystal, they cannot be fully eliminated merely by letting said defects be released to the outside.

For the resolution of the above-mentioned problem, therefore, the Czochralski method, involving the concurrent application of a magnetic field, (abbreviated as "MCZ method") has been developed. This MCZ method can restrict the convection of a molten mass of silicon by the application of a magnetic field, thereby stabilizing the solid-liquid interface and controlling the oxygen concentration in the single crystal silicon ingot. Therefore, it is possible to ensure the growth of a single crystal silicon ingot containing less than $7 \times 10^{17}$ cm$^{-3}$. As well, in the heat treatment involved in the manufacture of LSI the above-mentioned MCZ method prevents $SiO_2$ from being crystallized out, thereby preventing the occurrence of dislocation and stacking fault.

Nevertheless, said MCZ wafer fails to obtain the intrinsic gettering effect which is generally ensured by the semiconductor substrate cut out of the single crystal silicon ingot grown by the ordinary CZ method. The MCZ method has a very weak resistance to contamination occurring during the manufacture of LSI; presenting difficulties in the formation of a highly stable element. When heat treatment of 1000° C. is applied to a wafer cut out of a silicon ingot grown by the above-mentioned MCZ method, extremely fine defects (represented by black circles is FIG. 1) are produced in a region of low oxygen concentration (less than $6 \times 10^{17}$ cm$^{-3}$), though oxidized crystallized masses and stacking faults, illustrated by blank squares in FIG. 1, do not appear. The causes of the appearance of the above-mentioned extremely fine dot-like defects are not yet clearly defined. At any rate, this phenomenon is peculiar to the low-oxygen silicon crystal provided by the MCZ method.

SUMMARY OF THE INVENTION

This invention has been accomplished in view of the above-mentioned circumstances, and is intended to provide a semiconductor substrate which is saved from the occurrence of dislocation, stacking fault or warping resulting from heat treatment applied during the manufacture, a substrate capable of withstanding the unwanted production of extremely fine defects peculiar to a low-oxygen silicon crystal, and which further indicates a great resistance to various contaminations taking place during its manufacture.

To attain the above-mentioned object, this invention provides a silicon semiconductor substrate which has an oxygen concentration ranging between $3 \times 10^{17}$ cm$^{-3}$ and $7 \times 10^{17}$ cm$^{-3}$, and is provided with a gettering layer on the backside.

As used herein, the oxygen concentration is defined to mean the value measured by the infrared ray method specified in ASTM (1984) according to the following formula:

Oxygen concentration = (conversion coefficient) $2.45 \times 10^{17} \times$ (absorption coefficient) $\alpha$.

A gettering layer deposited on the backside of a semiconductor substrate embodying this invention may be prepared from a nonsingle crystal silicon layer, namely, a polycrystalline silicon layer, amorphous silicon layer or a layer of high density and stacking fault.

BRIEF DESCRIPTION OF THE DRAWINGS

FIG. 1 is a coordinate system showing the relationship between the oxygen concentration in a silicon wafer and the occurrence of extremely fine dot type defects appearing on the surface of a heated treated wafer as well as between said oxygen concentration and the stacking defect;

DETAILED DESCRIPTION OF THE PREFERRED EMBODIMENTS

Figure 2:
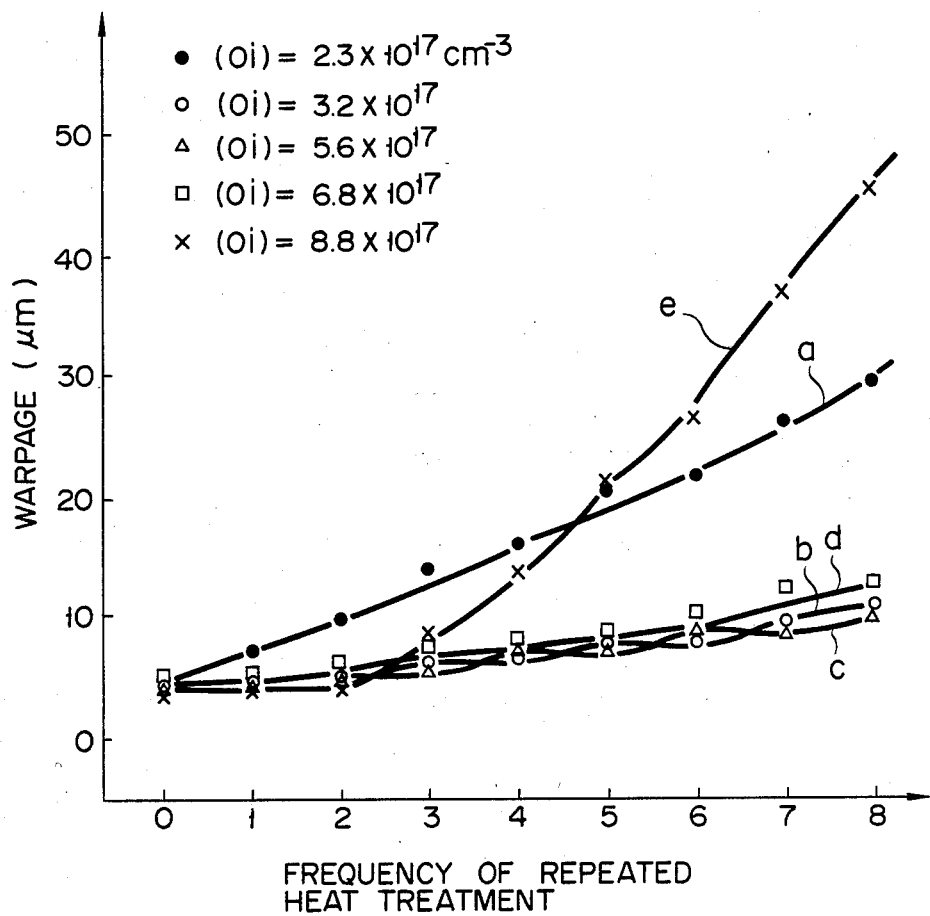
FIG. 2 is a coordinate system indicating the relationship between the frequency of heat treating the silicon substrate and the extent to which a wafer is warped.

This invention provides a silicon semiconductor substrate manufactured by the MCZ method and capable of providing a stable solid-liquid interface containing oxygen ranging from $3 \times 10^{17}$ cm$^{-3}$ to $7 \times 10^{17}$ cm$^{-3}$; provided, on its rear surface, with a nonsingle crystal silicon layer or a stacking default used as a gettering source for adsorbing a harmful metal, and characterized by an ability to withstand the occurrence of dislocation and stacking default resulting from heat treatment; equally capable of preventing the generation of extremely fine dot-shaped defects peculiar to a low oxygen crystal as well as the warping arising from said heat treatment applied during the manufacture of said semiconductor substrate, and possessing the capacity to resist contamination occurring during said manufacture.

A limitation is imposed in the oxygen concentration in the semiconductor substrate for the following reasons. If the oxygen concentration falls below $3 \times 10^{17}$ cm$^{-3}$, the semiconductor substrate easily tends to be warped. Conversely, if the oxygen concentration exceeds $7 \times 10^{17}$ cm$^{-3}$, the repeated heat treatment of said semiconductor substrate gives rise to warping caused by the internal stacking fault of said substrate.

The nonsingle crystal silicon layer acts to generate stacking fault capable of performing a gettering action on the backside of the substrate during its heat treatment. As used herein, the nonsingle crystal silicon layer is defined to mean a polycrystalline silicon layer and amorphous silicon layer. However, the amorphous silicon layer is ultimately converted into a polycrystalline silicon layer in the subsequent heat treatment of the semiconductor substrate.

The stacking fault (the so-called soft damage) provided on the backside of the semiconductor substrate performs the gettering action in the heat treatment of the semiconductor substrate. It is preferred that the density of the stacking fault appearing on the backside of the semiconductor substrate be higher than $3 \times 10^4$ cm$^{-2}$. If the density of said stacking fault falls below said level, the gettering action cannot be fully obtained. It is further preferred that the density of said stacking fault be higher than $1 \times 10^5$ cm$^{-2}$.

The deposition of an amorphous silicon layer on the backside of the silicon semiconductor substrate may be carried out by any known process. It is generally sufficient if said amorphous silicon layer is deposited by the CVD process with a thickness of, for example, more than 1000 Å. As far as the intended object of the present invention is concerned, no limitation is imposed on the upper limit of said specified thickness.

The aforementioned stacking default may be provided on the backside of the silicon semiconductor substrate by any optical process selected from among lapping, grinding, needle scribing or bombardment with particles of, for example, $SiO_2$ or $Al_2O_3$.

This invention will become more apparent by reference to the following examples.

EXAMPLE 1

5 kinds of silicon wafers, respectively, having different oxygen concentrations ($2.3 \times 10^{17}$ cm$^{-3}$, $3.2 \times 10^{17}$ cm$^{-3}$, $5.6 \times 10^{17}$ cm$^{-3}$, $6.8 \times 10^{17}$ cm$^{-3}$ and $8.8 \times 10^{17}$ cm$^{-3}$) and the same crystal plane orientation (100), were cut out of a single crystal silicon ingot grown by the MCZ process. Later, deposited on the backside of each wafer by the decompressed CVD process, was a polycrystalline silicon layer with a thickness of 5000 Å, providing five different silicon substrates A-E. These different silicon substrates A-E were heat treated 8 times, each application lasting for 2 hours. Determination was made of the warpages of said substrate samples A-E, the results being set forth in FIG. 2. Curves a-e given in FIG. 2 represent the warpages of said substrate samples A-E. FIG. 2 shows that a substrate A, having a smaller oxygen concentration than $3 \times 10^{17}$ cm$^{-3}$ (curve a), and a substrate E, having a larger oxygen concentration than $7 \times 10^{17}$ cm$^{-3}$ (curve e), indicate a more noticeable warpage as the heat treatment is repeated with increasing frequency, and, in contrast, that the substrates B-D, having an oxygen concentration ranging between $3 \times 10^{17}$ cm$^{-3}$ and $7 \times 10^{17}$ cm$^{-3}$ (curves b-d), were reduced in warpage.

Figure 3:
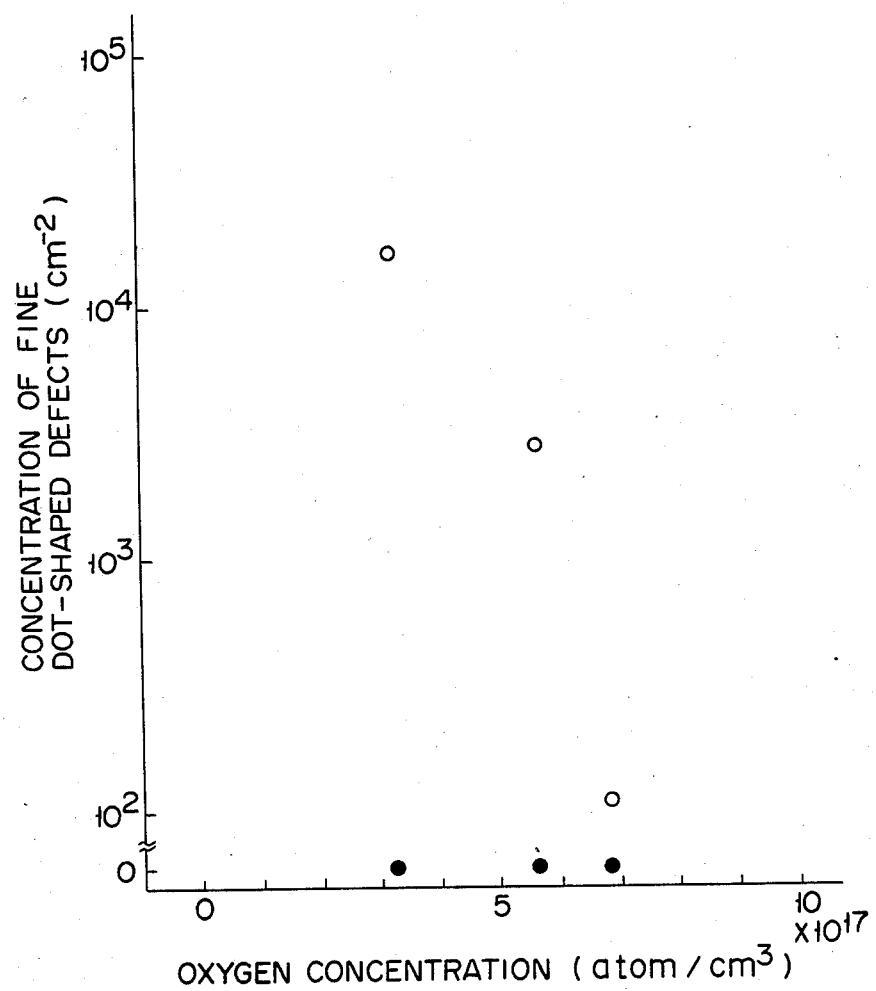
FIG. 3 is a coordinate system illustrating the relationship between the oxygen concentration in the silicon substrate and the occurrence of extremely fine dot type defects appearing in a repeatedly heat-treated substrate.

Heat treatment at 1000° C. and lasting 2 hours was applied eight times to silicon substrates F-H (controls) having oxygen concentrations as $3.2 \times 10^{17}$ cm$^{-3}$, $5.6 \times 10^{17}$ cm$^{-3}$ and $6.8 \times 10^{17}$ cm$^{-3}$ and prepared in substantially the same manner as the silicon substrates B-E (Example 1) provided with a polycrystalline silicon layer, except that said polycrystalline silicon layer was not formed on the backside. Later, determination was made of the growth of extremely fine defects on the surface of the respective control substrates, the results being set forth in FIG. 3. Black circles shown therein represent the property of the polycrystalline silicon substrates of this invention, while white circles denote the property of the controls. As seen from FIG. 3, the deposition of a polycrystalline layer on the backside of a silicon substrate can suppress the growth of extremely fine dot-shaped defects, thereby ensuring an excellent gettering effect.

Figure 4:
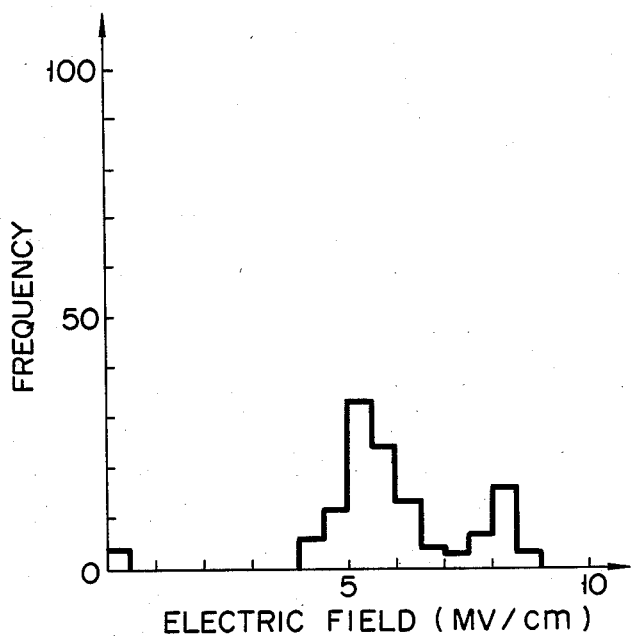
FIG. 4 diagrammatically indicates the distribution of the withstand voltage of an oxide layer deposited on the surface of a silicon substrate having an oxygen concentration of $5.6 \times 10^{17}$ cm$^{-3}$.
Figure 5:
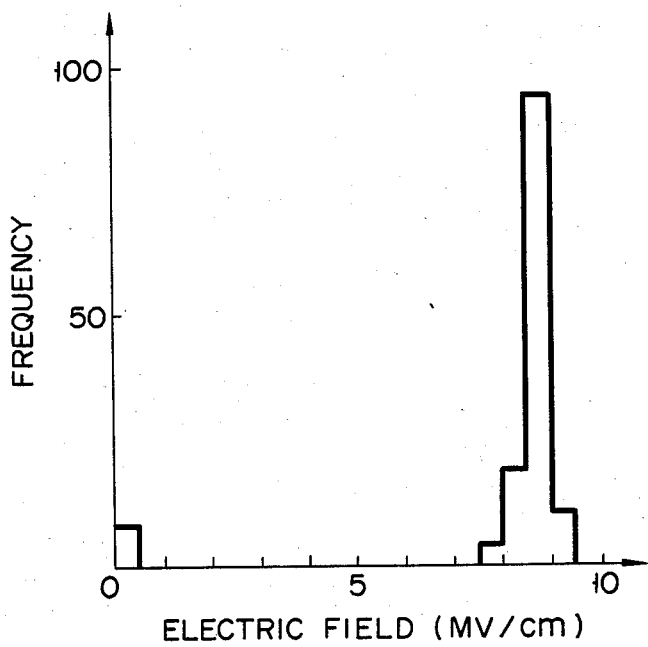
FIG. 5 diagrammatically shows the distribution of the withstand voltage of the oxidized surface of a silicon substrate provided with a polycrystalline silicon layer on the backside.

Further, heat treatment at 1000° C. was applied for 25 minutes to a silicon substrate C which had an oxygen concentration of $5.6 \times 10^{17}$ cm$^{-3}$ and whose backside was coated with a polycrystalline silicon layer, as well as to a silicon substrate G which had the same oxygen concentration but whose backside was not coated with a polycrystalline silicon layer. Thus, a silicon oxide film was deposited on the surface of both silicon substrates C, G with a thickness of 340 Å. Determination was made of the withstand voltage of said silicon oxide film, the results being set forth in FIGS. 4 and 5. FIG. 4 shows the withstand voltage property of the silicon substrate G. FIG. 5 represents the withstand voltage property of the silicon substrate C. As seen from FIGS. 4 and 5, the deposition of a polycrystalline silicon layer on the backside of a semiconductor substrate noticeably improved the distribution of the withstand voltage property of an oxide layer.

EXAMPLE 2

A silicon wafer having an oxygen concentration of $5.6 \times 10^{17}$ cm$^{-3}$ and crystal plane orientation (100) was cut out of a single crystal ingot grown by the MCZ process. Later, machining warpage was purposely produced by lapping on the backside of said wafer. Heat treatment was then applied. As a result, a silicon substrate was formed whose oxygen density ranged between $1 \times 10^2$ cm$^{-2}$ – $1 \times 10^6$ cm$^{-2}$ and which was provided with a stacking fault.

Figure 6:
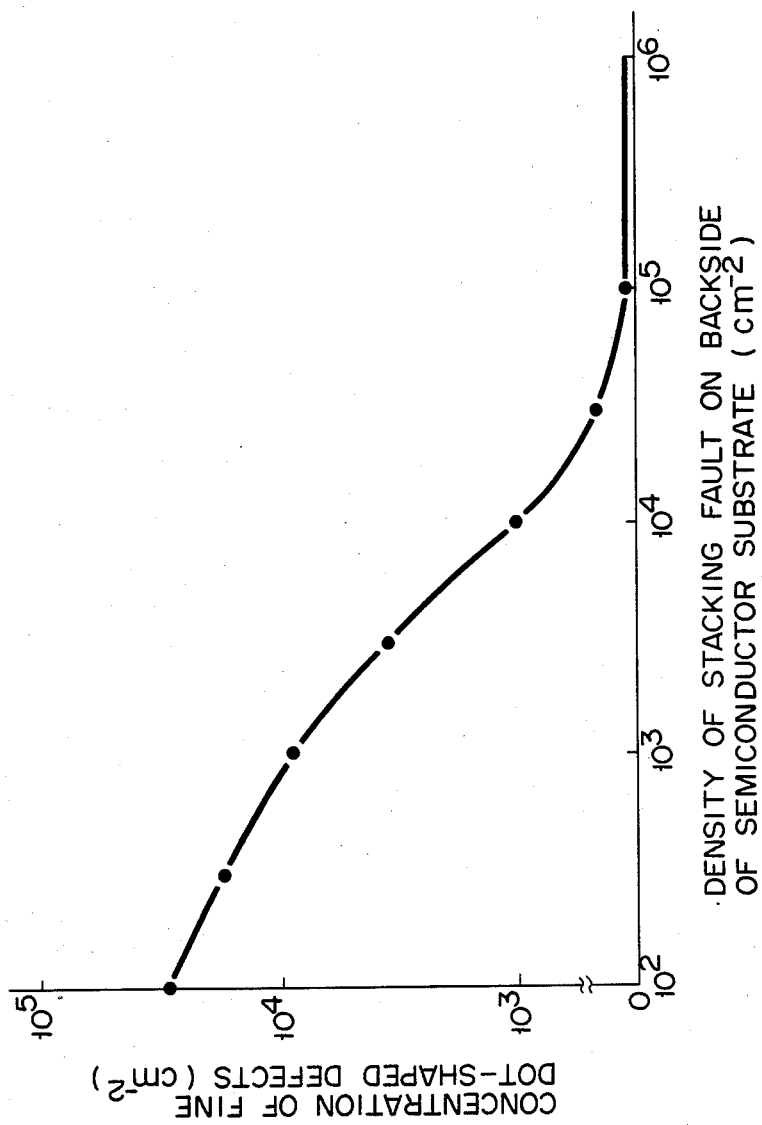
FIG. 6 diagrammatically sets forth the relationship between the extent of the stacking fault appearing on the backside of a silicon substrate and the extent of extremely fine dot type defects produced in a repeatedly heat-treated silicon substrate.

A heat treatment at 1000° C. and lasting 2 hours was applied eight times to a silicon substrate having a different stacking fault from that described above. Later, determination was made of the growth of extremely fine dot-shaped defects on said silicon substrate, the results being set forth in FIG. 6. It is seen from FIG. 6 that the growth of extremely fine dot-shaped defects could be prevented on the surface of a silicon substrate whose backside was provided with a stacking fault having a greater density than $3 \times 10^4$ cm$^{-2}$, or, particularly, greater than $1 \times 10^5$ cm$^{-2}$, thereby ensuring an excellent gettering effect.

Further, heat treatment was carried out at 1000° C. for 25 minutes, in an atmosphere of dry oxygen, to a silicon substrate whose backside was provided with a stacking fault having a density of $1 \times 10^5$ cm$^{-2}$. As a result, a silicon oxide layer was formed with a thickness of 340 Å on the surface of the silicon substrate. Determination was made of the withstand voltage property of said silicon oxide layer, proving that as good a withstand voltage property was obtained as in the case of the semiconductor substrate of Example 1 shown in FIG. 5.

What is claimed is:

1. A semiconductor device comprising a silicon semiconductor substrate whose oxygen concentration ranges between $3 \times 10^{17}$ cm$^{-3}$ to $7 \times 10^{17}$ cm$^{-3}$ and whose backside is provided with a gettering layer of a nonsingle crystalline silicon layer, the gettering layer having a stacking fault density greater than $3 \times 10^4$ cm$^{-2}$.

2. The silicon semiconductor substrate according to claim 1, wherein said nonsingle crystalline silicon layer is formed of a polycrystalline silicon layer.

3. The silicon semiconductor substrate according to claim 1, wherein said nonsingle crystalline silicon layer is composed of an amorphous silicon layer.

4. The silicon semiconductor substrate according to claim 1, wherein said nonsingle crystalline silicon layer has a greater thickness than 1000 Å.

5. The silicon semiconductor substrate according to claim 1, wherein said stacking fault has a greater density than $1 \times 10^5$ cm$^{-2}$.

6. The silicon semiconductor substrate according to claim 1, whose oxygen concentration ranges between 3.2 to $6.8 \times 10^{17}$ cm$^{-3}$.

7. A method of manufacturing a silicon semiconductor substrate comprising the steps of:
   (a) growing a semiconductor substrate by the magnetic Czochralski method;
   (b) providing an oxygen concentration in the semiconductor substrate in the range of about $3 \times 10^{17}$ cm$^{-3}$ to $7 \times 10^{17}$ cm$^{-3}$; and
   (c) forming a gettering layer of a nonsingle crystalline silicon layer on the backside of the substrate, the gettering layer having a stacking fault density greater than $3 \times 10^4$ cm$^{-2}$.

8. The method according to claim 7, wherein said stacking fault has a density greater than $1 \times 10^5$ cm$^{-2}$.

9. The method according to claim 7, wherein the oxygen concentration in the semiconductor substrate is in the range of $3.2 \times 10^{17}$ cm$^{-3}$ to $6.8 \times 10^{17}$ cm$^{-3}$.

* * * * *